United States Patent [19]
Yurek

[11] Patent Number: 4,850,098
[45] Date of Patent: Jul. 25, 1989

[54] METHOD AND APPARATUS TO ENHANCE THE SENSITIVITY OF CYLINDRICAL MAGNETOSTRICTIVE TRANSDUCER TO MAGNETIC FIELDS

[75] Inventor: Aileen M. Yurek, Alexandria, Va.

[73] Assignee: The United States of America as represented by the Secretary of the Navy, Washington, D.C.

[21] Appl. No.: 181,996

[22] Filed: Apr. 15, 1988

[51] Int. Cl.[4] ............................................. G01R 33/02
[52] U.S. Cl. .................................. 29/527.2; 324/244; 350/376
[58] Field of Search ............... 73/705,800, DIG. 2, 73/655, 657; 356/32–35; 250/227; 350/320, 371, 375, 376; 324/244, 249, 260, 96; 29/605, 527.2; 374/187, 190, 191, 196; 367/156, 168, 140, 149

[56] References Cited

U.S. PATENT DOCUMENTS

| | | | |
|---|---|---|---|
| 3,323,200 | 6/1967 | McKeon et al. | 29/605 |
| 4,442,350 | 4/1984 | Rashleigh | 324/96 |
| 4,630,358 | 12/1986 | Taylor et al. | 29/594 |
| 4,644,273 | 2/1987 | Bobb | 324/244 |
| 4,690,500 | 9/1987 | Hayami et al. | 350/96.26 |

OTHER PUBLICATIONS

Koo et al., "Characteristics of Fiber-Optic Magnetic-Field Sensors Employing Metallic Glasses", OPTICS Letters, vol. 7, No. 7, Jul. 1982.
Rashleigh, "Magnetic-Field Sensing with a Single-Mode Fiber", OPTICS Letter, vol. 6, No. 1, Jan. 1981.
Bucholtz et al., "Preparation of Amorphous Metallic Glass Transducers or use in Fiber Optic Magnetic Sensors", J. Appl. Phys. 61(8), Apr. 15, 1987.

Primary Examiner—Stewart J. Levy
Assistant Examiner—Robert R. Raevis
Attorney, Agent, or Firm—Thomas E. McDonnell; Peter T. Rutkowski

[57] ABSTRACT

A fiber optic sensor using the treated coil of optical fiber as a structural support system for the sensor, and a method for making such a sensor.

11 Claims, 2 Drawing Sheets

METHOD AND APPARATUS TO ENHANCE THE SENSITIVITY OF CYLINDRICAL MAGNETOSTRICTIVE TRANSDUCER TO MAGNETIC FIELDS

BACKGROUND OF THE INVENTION

1. Field of the Invention

The present invention relates generally to a novel fiber optic sensor device, and a method of manufacture therefor.

2. Description of the Prior Art

The following patents, U.S. Pat. Nos. 4,297,887 to Bucaro, 4,363,114 to Bucaro et al., and 4,442,350 to Rashleigh each generally disclose the use of fiber optics in a sensor.

It is known that the theoretical responsivity of fiber optic sensors increases linearly with fiber length, and that fiber strip metallic glass magnetostrictive sensors have severe limitations for use with large fiber length. This trade-off has led to fiber optic sensors having cylinders of a metallic glass magnetostrictive material formed by epoxying a number of layers of metallic glass ribbon together into a cylindrical form. An optical fiber is then wrapped around the cylinder and epoxied in place. Because the optical fiber must be wrapped around the metallic glass cylinder under tension so that the strain generated in the metallic glass ribbon can be transferred from the magnetostrictive material to the fiber, at least four layers of metallic glass must be used to form the cylinder strong enough to support the fiber winding process.

The use of multiple layers of metallic glass generates demagnetization effects and reduces the strain transfer efficiency between the optical fiber and the metallic glass sensing material.

The deleterious effects of demagnetization and inefficient strain transfer due to multiple layers of metallic glass are alleviated by Applicants' novel invention.

OBJECTS OF THE INVENTION

Accordingly, a first object of applicant's disclosed invention is to produce an interferometric sensor, for detecting magnetic fields, using a fiber optic output system.

A second object of Applicant's invention is to overcome the shortcomings of the prior art in sensitivity by using a novel method of manufacture to produce a novel sensor device that uses a single layer of metallic glass rather than the multiple layers of metallic glass necessary in the prior art.

A third object of Applicant's invention is to provide a more sensitive sensor using fiber optics for sensing temperature, electric fields, current, pressure, and different chemicals.

A fourth object of Applicant's invention is to provide a sensor with less demagnetization than was available in the prior art.

A fifth object of Applicant's invention is to provide a sensor with better strain transfer efficiency than the prior art.

SUMMARY OF THE INVENTION

The above objects and other advantages are provided by a sensor including cylindrical support structure capable of optical transmission and a sensory system affixed to an interior surface of the support structure wherein optical transmission system characteristic of the support structure generates an output.

Further advantages are provided by a method of manufacturing a sensor including the steps of forming a cylindrical support capable of optical transmission and bonding a sensory material to an interior wall thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE DRAWINGS

Figure 1:
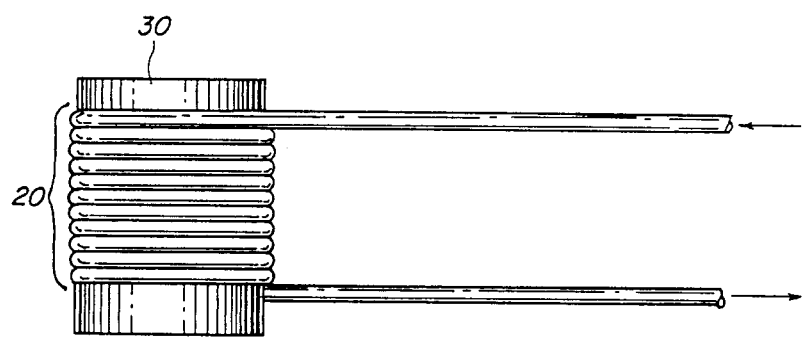
FIG. 1 is a side view of a fiber optic sensor according to the present invention.
Figure 2:
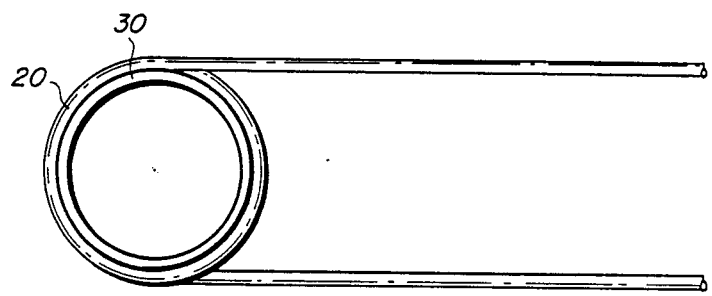
FIG. 2 is an axial view along the cylindrical axis of a fiber optic sensor according to the present invention.

Referring now to FIG. 1, a sensor according to Applicant's invention generally includes a coil of optical fiber wherein adjacent individual fiber windings are bonded into a structural cylinder 20 and a single layer of magnetostrictive metallic glass 30 is epoxied to the inner surface of the cylinder 20 as shown in FIG. 2 using a low modulus epoxy such as the commercially available epoxy Epotek.

Figure 3:
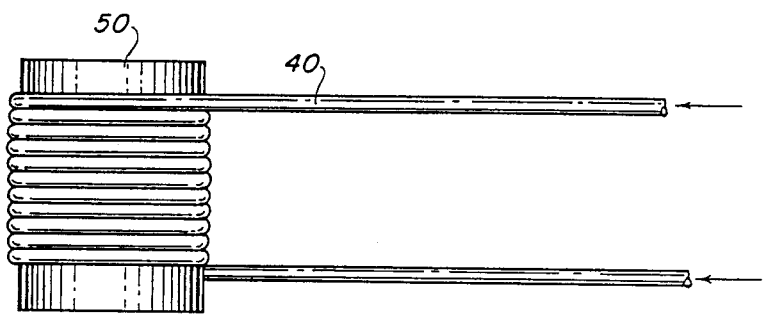
FIG. 3 is a view of an optical fiber wound around a mandrel.

Applicant's novel sensor described above is manufactured by a novel method generally including the steps of:

Wrapping a jacketed optical fiber 40 in a coil as shown in FIG. 3 around a mandrel 50 having a low friction surface material such as TEFLON fusing together the jacket layers of adjacent windings of the optical fiber. The jacket material can be nylon, UV acrylate, or Hytrel. This step of fusing the adjacent windings can be described as softening the jacket by applying a material capable of fusing the jacket material, such as an organic solvent or a corrosive such as sulfuric acid; until the windings stick together then blotting and rinsing away the fusing material. In another emobodiment the windings are fused by applying a UV curing epoxy, obviating the need for a corrosive or solvent.

Figure 4:
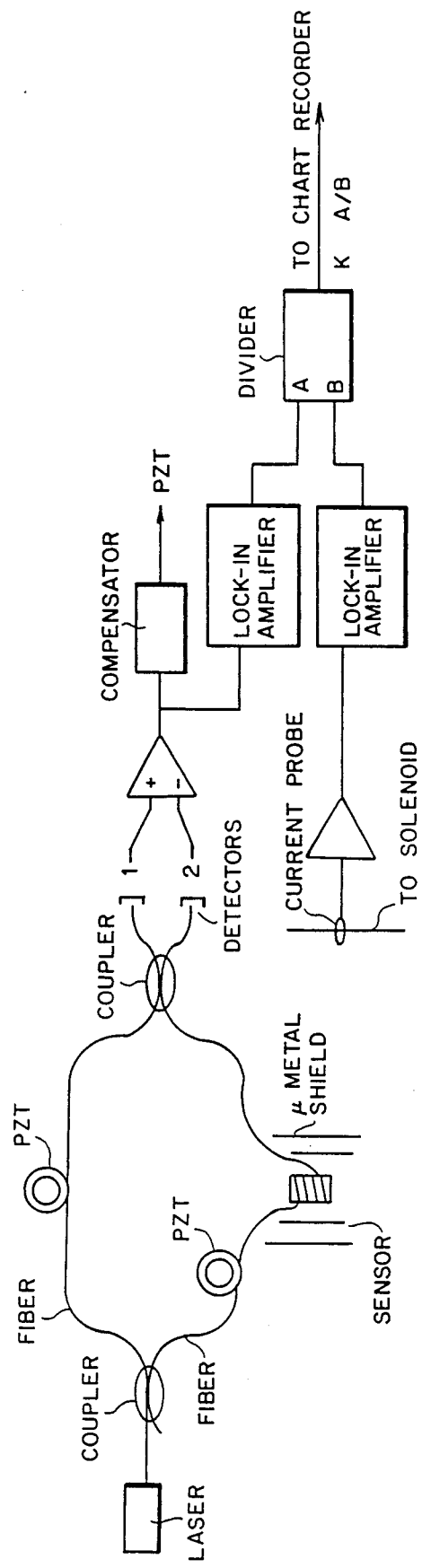
FIG. 4 is a schematic diagram of a Mach Zehnder interferometer system.

After the windings are fused and removed from the mandrel, the coil acts as a cylindrical support structure. A single layer of metallic glass 30 is then epoxied to the interior surface of the cylindrical structure. In the embodiment described above, the sensor is responsive to magnetic fields due to the sensitivity of the magnetostrictive metallic glass. Installing Applicant's invention in the signal arm of a Mach Zehnder interferometer (shown in FIG. 4) used to measure phase shift in the interferometer as a function of frequency for two applied DC fields, Applicant's invention is found to improve the responsive of the cylindrical transducer by three orders of magnitude. This is due in large part to the fact that a single layer of metallic glass has less deleterious demagnetization effects and since the fiber is not wound around a cylinder of metallic glass strain transfer efficiency is improved.

In other embodiments contemplated by the invention coatings sensitive to temperature, elastic fields, current, pressure and chemicals could be applied in place of the metallic glass thereby providing improvements to fiber optic sensors in other applications.

In a preferred embodiment, the interior diameter of the structural cylinder is 1.5" in diameter.

Applicant has described her invention in a portion of an article written with others and wishes to incorporate that article herein by reference. "Preparation of Amorphous Metallic Glass Transducers for use in Fiber Optic Magnetic Sensors" by F. Bucholtz et al., which appeared in the Journal of Applied Physics, Vol. 61, No. 3, pp. 3790, Apr. 15, 1987.

Obviously, numerous additional modifications and variations of the present invention are possible in light of the above teachings. It is therefore to be understood that within the scope of the appended claims, the invention may be practiced otherwise than as specifically described herein.

What is claimed for Letters Patent is:

1. A method of manufacturing a sensor comprising the steps of:
   forming a cylindrical support structure comprising optical transmission means, wherein said step of forming a cylindrical support structure includes winding an optical fiber on to a mandrel composed of a low friction material and applying a bonding means to said wound optical fiber to fuse adjacent windings of said optical fiber; and
   bonding a sensing means to an interior wall of said cylindrical support structure, wherein said sensing means comprises a magnetostrictive metallic glass surface.

2. A method of manufacturing a sensor as recited in claim 1 wherein said bonding means comprises a UV curing epoxy.

3. A method of manufacturing a sensor comprising the steps of:
   forming a cylindrical structure comprising optical transmission means, wherein said step of forming a cylindrical support structure includes winding a jacketed optical fiber on to a mandrel composed of a low friction material, applying a softening means to said wound optical fiber to soften a jacket layer of said fiber, and bonding adjacent windings of said optical fiber together by controlling the previous step of applying softening means; and
   bonding a sensing means to an interior wall of said cylindrical support structure, wherein said sensing means comprises a magnetostrictive metallic glass surface.

4. A method of manufacturing a sensor as recited in claim 3 wherein said matnetostrictive metallic glass surface comprises a single layer.

5. A method of manufacturing a sensor as recited in claim 4 wherein said low friction material of said mandrel comprises TEFLON.

6. A method of manufacturing a sensor as recited in claim 5 wherein said softening means is a corrosive capable of softening said jacketing of said optical fiber for the step of bonding adjacent windings.

7. A method of manufacturing a sensor as recited in claim 6 wherein said step of bonding a sensing means to an interior wall comprises epoxying said magnetostrictive metallic glass surface to an interior wall of said cylindrical support structure with a low modulus epoxy.

8. A method of manufacturing a sensor as recited in claim 7 wherein said corrosive comprises sulfuric acid.

9. A method of manufacturing a sensor as recited in claim 5 wherein said softening means is a organic solvent capable of softening said jacketing of said optical fiber for the step of bonding adjacent windings.

10. A method of manufacturing a sensor as recited in claim 3 wherein said softening means is a organic solvent capable of softening said jacketing of said optical fiber for the step of bonding adjacent windings.

11. A method of manufacturing a sensor having a single layer of magnetostrictive metallic glass, said method comprising the steps of:
    forming a cylindrical support structure by first wrapping a jacketed optical fiber in a coil around a mandrel composed of a low friction material;
    fusing together adjacent windings of the coil;
    removing the cylindrical support structure from the mandrel; and
    bonding a single layer of magnetostrictive metallic glass to an interior surface of the cylindrical support structure.

* * * * *